United States Patent [19]

Sood

[11] Patent Number: 4,520,465
[45] Date of Patent: May 28, 1985

[54] METHOD AND APPARATUS FOR SELECTIVELY PRECHARGING COLUMN LINES OF A MEMORY

[75] Inventor: Lal C. Sood, Austin, Tex.
[73] Assignee: Motorola, Inc., Schaumberg, Ill.
[21] Appl. No.: 491,946
[22] Filed: May 5, 1983
[51] Int. Cl.³ ............................................. G11C 11/40
[52] U.S. Cl. ..................................... 365/203; 365/230
[58] Field of Search ........................ 365/203, 189, 230

[56] References Cited

U.S. PATENT DOCUMENTS 4,318,014 3/1982 McAlister ............................ 365/203
4,414,547 11/1983 Knapp et al. ........................ 365/203
4,417,327 11/1983 Smith .................................. 365/203

Primary Examiner—Terrell W. Fears
Attorney, Agent, or Firm—Anthony J. Sarli, Jr.; Jeffrey Van Myers; James L. Clingan, Jr.

[57] ABSTRACT

A memory circuit, having an array with adjacent side-by-side portions, has half of the array precharged by precharging alternate portions. Pairs of adjacent portions have common sense amplifiers which receive signals from only the precharged portion of the pair of adjacent portions. The sense amplifiers are then arranged so that the conductor lines to the output pads are uninterrupted.

15 Claims, 3 Drawing Figures

METHOD AND APPARATUS FOR SELECTIVELY PRECHARGING COLUMN LINES OF A MEMORY

FIELD OF THE INVENTION

This invention relates to memory circuits, and more particularly, to memory circuits for which column lines are precharged prior to reading data thereon.

BACKGROUND OF THE INVENTION

Precharging column lines of a memory prior to reading data has been an effective technique for improving speed and power. The precharging can occur in response to a timing signal or a signal generated in response to an address transition. Such a signal generated for precharging column lines is often known as an equalization pulse because it equalizes the voltage on the column lines, particularly for memories for which there are two bit lines for each column. One bit line carries the true data bit and the other carries the complementary data bit. Upon being precharged in response to an equalization pulse, the two bit lines are equalized in voltage. The technique is particularly popular for static random access memories (SRAMs).

One aspect of precharging is that a significant amount of charge is required to charge all of the columns due to the substantial capacitance of each bit line. At a typical operating speed, the power required for precharging is typically more than half of the entire power requirements of the memory. One technique to reduce power consumption is to precharge only one half of the array, the half from which the data is to be selected. A predetermined address bit which indicates which half contains the selected data is also used to determine which half is precharged. For a byte-wide memory, a memory which provides eight parallel bits of data for a single address, the technique of precharging only half of the array has resulted in doubling the required sense amplifiers and output drivers as well as a reduction in speed. The array is divided into left and right halves. The left and right halves are each further divided into eight planes. Consequently, each half is capable of supplying a byte. Each half has its own set of eight sense amplifiers and output drivers. The half which is to provide the byte of data is precharged. The outputs of the output drivers associated with the selected half are coupled to the output pads of the memory while the outputs of the output drivers associated with the unselected and unprecharged half are decoupled from the output pads.

Having an architecture of a byte on the left half of the array and a byte on the right half of the array does allow for reducing the power consumption due to precharging by one half. There are other problems created, however. There are sixteen sense amplifiers and output drivers instead of eight. The routing of the output is complicated. The distance between the outputs of the output drivers and the output pads is increased, increasing capacitance. Also the post-decoding transistors for coupling drivers of the selected half to the output pads add resistance to the current path which is intended to be a minimum resistance path because it is the path which provides the actual output drive. In order to achieve the reduced power, chip area is increased due to the additional circuitry and routing, and speed is reduced due to increased capacitance and resistance in the output current path.

SUMMARY OF THE INVENTION

An object of the present invention is to provide an improved method and apparatus for selectively precharging column lines of a memory.

Another object of the present invention is to provide an improved method and apparatus for precharging one half of a memory array.

Yet another object of the invention is to provide an improved method and apparatus for precharging a multiple bit output memory.

These and other objects are achieved in accordance with the present invention by a memory circuit which has a memory array which has a plurality of intersecting row lines and column lines in which data bits are read on the column lines and in which a column line is precharged before an output is read on that column line. The memory array is divided into at least four adjacent side-by-side portions, wherein the first portion is adjacent to the second portion, the second portion is between the first and third portions, the third portion is between the second and fourth portions, and the fourth portion is adjacent to the third portion. A precharging circuit precharges the column lines of the first and third portions when a predetermined address signal is in a first logic state and precharges the column lines of the second and fourth portions when the predetermined address signal is in a second logic state.

DESCRIPTION OF A PREFERRED EMBODIMENT

Figure 1:
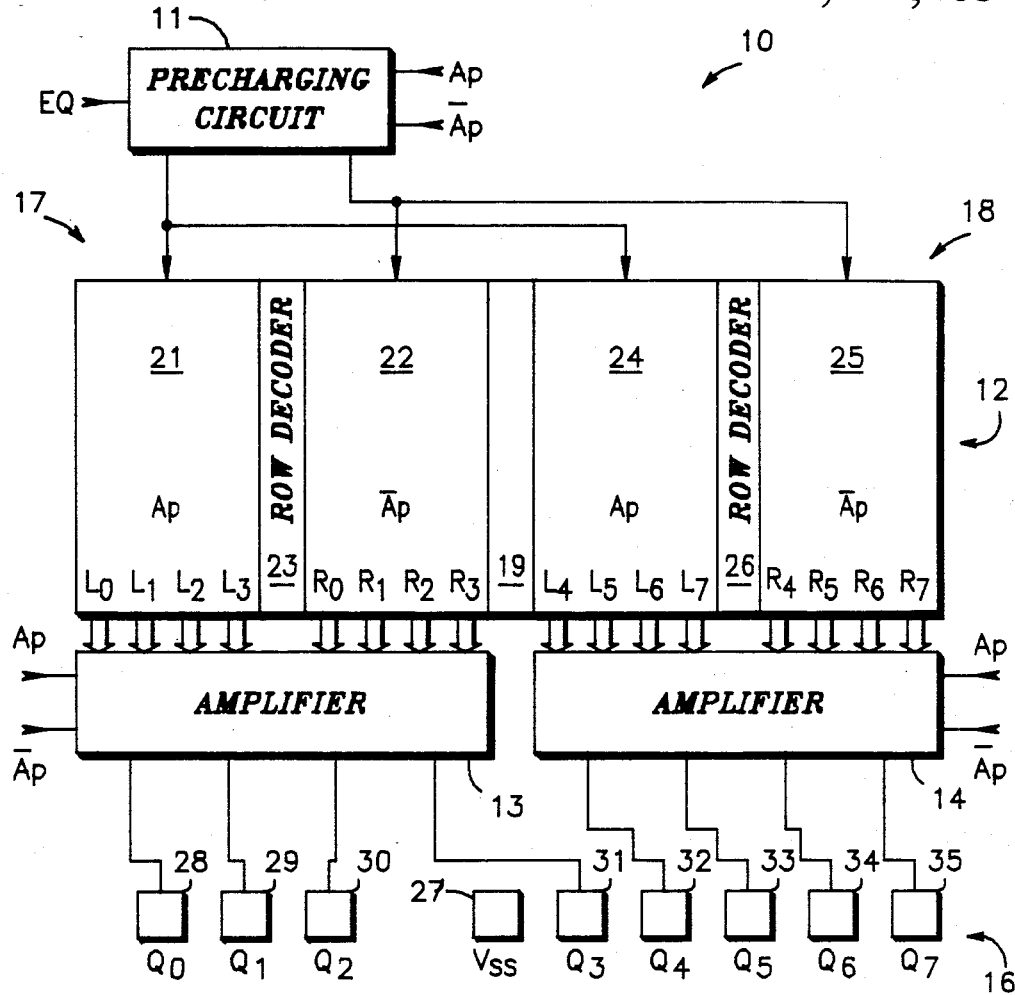
FIG. 1 is a layout of a memory array and output pads of a memory according to a preferred embodiment of the invention.

Shown in FIG. 1 is a layout of a memory circuit 10 comprised generally of a precharging circuit 11, a memory array 12, an amplifier-driver 13, an amplifier-driver 14, and a plurality of pads 16. Memory array 12 is comprised of a left half 17, a right half 18, and a power carrier region 19 interposed therebetween. Left half 17 is comprised of a portion 21, and portion 22, and a row decoder 23 interposed therebetween. Right half 18 is comprised of a portion 24, a portion 25, and a row decoder 26 interposed therebetween. Plurality of pads 16 is comprised of a power supply pad 27 for $V_{ss}$ which is typically connected to ground, an output pad 28 for providing a data output signal $Q_0$, an output pad 29 for providing a data output signal $Q_1$, an output pad 30 for an output signal $Q_2$, an output pad 31 for an output signal $Q_3$, an output pad 32 for an output signal $Q_4$, an output pad 33 for an output signal $Q_5$, an output pad 34 for an output signal $Q_6$, and an output pad 35 for an output signal $Q_7$. The relative position of pads 28-35 shown in FIG. 1 is that of industry-standard byte-wide SRAMs. Pads 28-35 extend from left to right in consecutive order corresponding to output signals $Q_0$ to $Q_7$ with $V_{ss}$ pad 27 interposed between $Q_2$ pad 30 and $Q_3$ pad 31.

Figure 2:
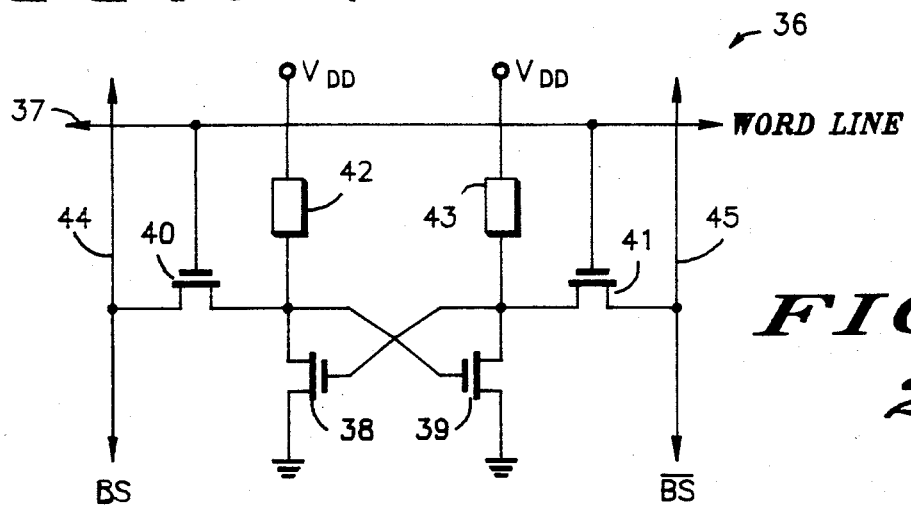
FIG. 2 is an circuit diagram of a memory cell which may be used in the memory array of FIG. 1.

Shown in FIG. 2 is a conventional memory cell 36 comprised of a word line 37, two cross-coupled transistors 38 and 39, two coupling transistors 40 and 41, and two loads 42 and 43. Memory cell 37 provides complementary data on bit sense lines 44 and 45 in response to receiving a signal on word line 37. Each portion 21, 22, 24, and 25 of memory array 12 is comprised of a plurality of memory cells, which may be for example, like memory cell 36 of FIG. 2. The memory cells are at intersections of rows and columns. Using memory cell 36 as an example, a single row would be word line 37 and a single column would be bit lines 44 and 45. Prior to reading data from memory cell 36, bit lines 44 and 45 would both be precharged in a conventional manner.

Precharge circuit 11 has a first input for receiving an equalization pulse EQ, a second input for receiving address signal $A_p$, a third input for receiving complementary address signal $\overline{A}_p$, a first output coupled to portions 21 and 24, and a second output coupled to portions 22 and 25. Portions 21, 22, 24, and 25 are arranged in an adjacent, side-by-side manner. Portion 21 is adjacent to portion 22. Portion 22 is between portion 21 and 24. Portion 23 is between portions 22 and 25. Portion 25 is adjacent to portion 24. Portion 21 has four outputs $L_0$, $L_1$, $L_2$, and $L_3$ coupled to amplifier-driver 13. Portion 22 has four outputs $R_0$, $R_1$, $R_2$, and $R_3$ coupled to amplifier-driver 13. Portion 24 has four ouputs $L_4$, $L_5$, $L_6$, and $L_7$ coupled to amplifier-driver 14. Portion 25 has four outputs, $R_4$, $R_5$, $R_6$, and $R_7$ coupled to amplifier-driver 14. Amplifier-driver 13 has outputs $Q_0$, $Q_1$, $Q_2$, and $Q_3$ connected to output pads 28, 29, 30, and 31, respectively. Amplifier-driver 14 has outputs $Q_4$, $Q_5$, $Q_6$, and $Q_7$ connected to output pads 32, 33, 34, and 35, respectively. Address signals $A_p$ and $\overline{A}_p$ are coupled to amplifier-drivers 13 and 14. The arrangement of the output pads 28-35 shown in FIG. 1, as stated previously, is that of a conventional byte-wide SRAM. The output pads 28-35 are arranged in order of output bits, $Q_0$-$Q_7$ with a pad 27 for coupling to $V_{ss}$, typically ground, interposed between the output pads which provide bits $Q_2$ and $Q_3$.

In operation, circuit 10 responds to an equalization pulse EQ and address signals $A_p$ and $\overline{A}_p$ by precharging half of array 12 and then providing bits $Q_0$-$Q_7$ from the precharged half. In response to pulse EQ and the logic state of signals $A_p$ and $\overline{A}_p$, precharging circuit 11 precharges either portions 21 and 24 or portions 22 and 25. If signal $A_p$ is a logic high then the half of array 12 comprised of portions 21 and 24 is precharged. If signal $A_p$ is a logic low, then the half of array 12 comprised of portions 22 and 25 is precharged. Amplifier-drivers 13 and 14 provide the data from the precharged half to pads 28-35. If signal $A_p$ is a logic high, then amplifier-driver 13 provides output bits $Q_0$-$Q_3$ as represented by signals $L_0$-$L_3$, respectively and amplifer-driver 14 provides output bits $Q_4$-$Q_7$ as represented by signals $L_4$-$L_7$, respectively. If signal $A_p$ is a logic low, then amplifier-driver 13 provides output bits $Q_0$-$Q_3$ as represented by signals $R_0$-$R_3$, respectively and amplifier-driver 14 provides output bits $Q_4$-$Q_7$ as represented by signals $R_4$-$R_7$, respectively.

Figure 3:
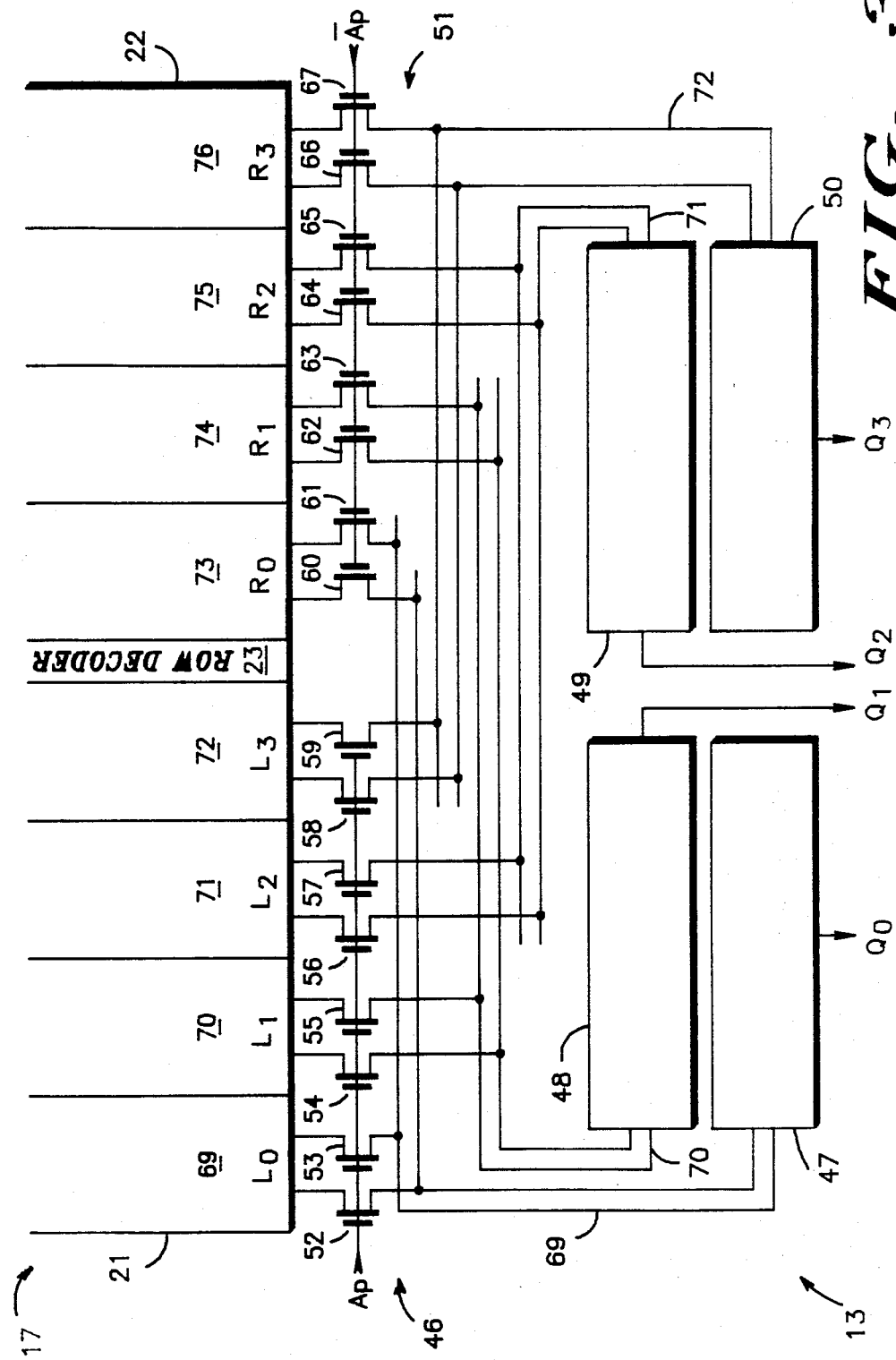
FIG. 3 is a layout of a portion of an interface between the memory array and output pads of FIG. 1.

Shown in FIG. 3, in more detail and in layout form, are left half 17 of memory array 12 and amplifier-driver 13. Amplifier-driver 13 comprises an $A_p$ coupler 46, a $Q_0$ amplifier 47, a $Q_1$ amplifier 48, a $Q_2$ amplifier 49, a $Q_3$ amplifier 50, and a $\overline{A}_p$ coupler 51. Coupler 46 comprises transistors 52-59. Coupler 51 comprises transistors 60-67. Each of the transistors 52-59 has a gate for receiving signal $A_p$. Each of the transistors 60-67 has a gate for receiving signal $\overline{A}_p$. There is a pair of transistors associated with each of signals $L_0$-$L_3$ and $R_0$-$R_3$ as follows; transistors 52 and 53 with signal $L_0$, transistors 54 and 55 with signal $L_1$, transistors 56 and 57 with signal $L_2$, transistors 58 and 59 with signal $L_3$, transistors 60 and 61 with signal $R_0$, transistors 62 and 63 with signal $R_1$, transistors 64 and 65 with signal $R_2$, transistors 66 and 67 with signal $R_3$. Each amplifier 47-50 is coupled to a pair of transistors of both couplers 46 and 51 by a pair of conductors 69, 70, 71 and 72, respectively. Conductor pair 69 connects transistor pair 52-53 and transistor pair 60-61 to $Q_0$ amplifier 47. Conductor pair 70 connects transistor pair 54-55 and transistor pair 62-63 to $Q_1$ amplifier 48. Conductor pair 71 connects transistor pair 56-57 and transistor pair 64-65 to $Q_2$ amplifier 49. Conductor pair 72 connects transistor pair 58-59 and transistor pair 66-67 to $Q_3$ amplifier 50. Each signal $L_0$-$L_3$ and $R_0$-$R_3$ has a true and complementary representation. When a logic high is received on the gates of the transistors of a transistor pair, that transistor pair couples the true and complementary representation of the signal, one of $L_0$-$L_3$ and $R_0$-$R_3$, with which it is associated to the conductor pair, one of 69-72, to which it is connected. Accordingly, when signal $A_p$ is a logic high, transistor pair 52-53 couples signal $L_0$ to $Q_0$ amplifier 47 via conductor pair 69, transistor pair 54-55 couples signal $L_1$ to $Q_1$ amplifier 48 via conductor pair 70, transistor pair 56-57 couples signal $L_2$ to $Q_2$ amplifier 49 via conductor pair 71, and transistor pair 58-59 couples signal $L_3$ to $Q_3$ amplifier 50 via conductor pair 72. With signal $A_p$ at a logic high, signal $\overline{A}_p$ is a logic low which turns off transistors 60-67 to prevent interference with signals $L_0$-$L_3$ which are carried on conductors 69-72. In the same way when signal $A_p$ is a logic low and $\overline{A}_p$ is a logic high, transistor pairs 60-61, 62-63, 64-65, and 66-67 couple signals $R_0$-$R_3$, respectively, to amplifiers 47-50, respectively, and transistors 52-59 are turned off. Amplifiers 47-50 sense and amplify the logic state of the received signal to provide output bits $Q_0$-$Q_3$.

Each signal $L_0$-$L_3$ and $R_0$-$R_3$ is representative of a logic state of a memory cell such as memory cell 36 of FIG. 2. Memory portion 21 is comprised of memory planes 69, 70, 71, and 72 each of which has a plurality of memory cells located at intersecting rows and columns. Likewise, portion 22 is comprised of memory planes 73, 74, 75, and 76 each of which has memory cells located at intersecting rows and columns. Planes 69-76 provide signal $L_0$-$L_3$ and $R_0$-$R_3$, respectively. When signal $A_p$ is a logic high, planes 69-72 are precharged. A cell from each plane 69-72 is then selected. Signals $L_0$-$L_3$ are provided as representative of the logic state of the selected memory cells. With signal $A_p$ at a logic high, signals $L_0$-$L_3$ are coupled to amplifier 47-50 which in turn provide output bits $Q_0$-$Q_3$ at the logic state indicated by signal $L_0$-$L_3$. When signal $A_p$ is a logic low and $\overline{A}_p$ is a logic high, planes 73-76 are precharged. A cell from each plane 73-76 is selected. Signals $R_0$-$R_3$ are provided as representative of the logic state of the selected memory cells. With signal $\overline{A}_p$ at a logic high, signals $R_0$-$R_3$ are coupled to amplifiers 47-50 which in turn provide output bits $Q_0$-$Q_3$ at the logic state indicated by signals $R_0$-$R_3$. Thus it is shown that only four amplifiers, amplifiers 47-50, are needed for the left half 17 of the array 12. The same structure as shown in FIG. 3 for left half 17 is also provided for right half 18. As is shown in FIGS. 1 and 3 there is no required decoding between amplifiers 47-50 and pads 28-31. With the same structure for amplifier-driver 14 as is shown for amplifier-driver 13 shown in FIG. 3, there is also no required decoding between amplifier-driver 14 and pads 32-35. Also the conductive paths between amplifier-drivers 13–14 and pads 28–35 do not cross each other. Accordingly, the conductive paths between amplifier-drivers 13–14 and pads 28–35 are uninterrupted. Consequently, the highest conductivity interconnect, for example, metal, is used.

FIG. 3 further shows that conductor pairs 69–72 are uninterrupted between couplers 46 and 51. Conductor pairs 69–72 can thus be made from the highest conductivity material, for example metal, available for making interconnect for memory circuit 10. Connections between transistors 52–59 and conductors 69–72 can be made by conventional metal to diffusion contacts. Transistor diffusion can be made to extend under conductors 69–72 by conventional fabrication techniques. Diffusions are also relatively low resistance so that outputs of memory cells which provide signals $L_0$–$L_3$ and $R_0$–$R_3$ face very little resistance prior to reaching amplifiers 47–50.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. A memory array having a plurality of intersecting row lines and column lines in which data bits are output on selected column lines and in which a column line is precharged before an output is read on that column line, wherein the memory array is divided into at least four adjacent side-by-side portions, wherein a first portion is adjacent to a second portion, the second portion is between the first portion and a third portion, and the third portion is between the second portion and a fourth portion; and wherein the column lines of the first and third portions are precharged when a predetermined address signal is in a first logic state and column lines of the second and fourth portions are precharged when the predetermined address signal is in a second logic state.

2. The memory array of claim 1 further comprising a first set of amplifiers for receiving data bits from the first portion when the predetermined address signal is in the first logic state and from the second portion when the predetermined address signal is in the second logic state.

3. The memory array of claim 2 further comprising a second set of amplifiers for receiving data bits from the third portion when the predetermined address signal is in the first logic state and from the fourth portion when the predetermined address is in the second logic state.

4. The memory array of claim 3 wherein each portion of the memory array provides four data bits of a byte and wherein each of the first and second sets of amplifiers comprises four sense amplifiers.

5. The memory array of claim 4 wherein the four sense amplifiers of the first set of amplifiers sense the logic states of the four data bits provided by the first portion when the predetermined address signal is in the first logic state and the logic states of the four data bits provided by the second portion when the predetermined address signal is in the second logic state.

6. The memory array of claim 5 wherein the four sense amplifiers of the second set of amplifiers sense the logic states of the four data bits provided by the third portion when the predetermined address signal is in the first logic state and the logic states of the four data bits provided by the fourth portion when the predetermined address signal is in the second logic state.

7. The memory array of claim 6 wherein precharging occurs in response to an equalization pulse.

8. In a memory array having a plurality of intersecting row lines and column lines in which data bits are output on selected column lines and in which a column line is precharged before an output is read on that column line, a method for precharging the column lines comprising the steps of:
  dividing the memory into at least four consecutively numbered, adjacent side-by-side portions; and
  precharging the column lines of odd-numbered portions when a control signal is in a first logic state and precharging the column lines of even-numbered portions when the control signal is in a second logic state.

9. The method of claim 8, wherein the precharging is further characterized as occuring for a duration of an equalization pulse.

10. A memory circuit, comprising:
  a memory array having a plurality of intersecting row lines and column lines in which data bits are output on selected column lines and in which a column line is precharged before an output is read on that column line, wherein the memory array is divided into at least four adjacent side-by-side portions, wherein a first portion is adjacent to a second portion, a fourth portion is adjacent to a third portion, the second portion is between the first and third portions, and the third portion is between the second and fourth portions; and
  precharging means for precharging the column lines of the first and third portions when a predetermined address signal is in a first logic state and precharging the column lines of the second and fourth portions when the predetermined address signal is in a second logic state.

11. The memory circuit of claim 10 wherein the precharging by the precharging means occurs in response to an equalization pulse.

12. The memory circuit of claim 11 further comprising:
  first reading means for reading data from the first portion when the predetermined address signal is in a first logic state and reading data from the second portion when the predetermined address signal is in a second logic state; and
  second reading means for reading data from the third portion when the predetermined address signal is in a first logic state and reading data from the fourth portion when the predetermined address signal is in a second logic state.

13. The memory circuit of claim 12 wherein the first and second reading means are further characterized as providing outputs which correspond to the data which is read.

14. The memory circuit of claim 13 further comprising output pads which receive the outputs of the first and second reading means on uninterrupted conductor lines.

15. The memory circuit of claim 14 wherein the conductor lines are metal.

* * * * *